(12) United States Patent
Brooks et al.

(10) Patent No.: US 11,973,326 B2
(45) Date of Patent: Apr. 30, 2024

(54) POWER DISTRIBUTION BOX

(71) Applicant: VERTIV CORPORATION, Columbus, OH (US)

(72) Inventors: James Brooks, Cottage Grove, MN (US); Josef Feigl, Arnstorf (DE); Brad Wilson, Lincoln, NE (US); Grant Young, Lincoln, NE (US); Alexander Zink, Burghaslach (DE)

(73) Assignee: VERTIV CORPORATION, Columbus, OH (US)

( * ) Notice: Subject to any disclaimer, the term of this patent is extended or adjusted under 35 U.S.C. 154(b) by 0 days.

(21) Appl. No.: 17/557,498

(22) Filed: Dec. 21, 2021

(65) Prior Publication Data

US 2022/0200250 A1 Jun. 23, 2022

Related U.S. Application Data

(60) Provisional application No. 63/129,035, filed on Dec. 22, 2020.

(51) Int. Cl.
*G06F 1/18* (2006.01)
*H02B 1/04* (2006.01)
*H02B 1/20* (2006.01)
*H02B 1/46* (2006.01)
*H05K 7/14* (2006.01)

(52) U.S. Cl.
CPC .............. *H02B 1/46* (2013.01); *G06F 1/189* (2013.01); *H02B 1/04* (2013.01); *H02B 1/202* (2013.01); *H05K 7/1492* (2013.01)

(58) Field of Classification Search
CPC . H02B 1/04; H02B 1/202; H02B 1/46; H05K 7/1492; G06F 1/189
See application file for complete search history.

(56) References Cited

U.S. PATENT DOCUMENTS 5,821,636 A * 10/1998 Baker ...................... H02J 3/38
307/64
7,646,109 B2 1/2010 Belady et al.
(Continued)

OTHER PUBLICATIONS

APB Symmetra PX 20kw, 208V, may be configured with pre-installed whips, retrieved from http://www.customnetworks.net/apc-symmetra-px-20kw-208v/.
(Continued)

*Primary Examiner* — Robert J Hoffberg
(74) *Attorney, Agent, or Firm* — Suiter Swantz IP (57) ABSTRACT

A power distribution box is disclosed. The power distribution box may include a housing including one or more panels. The one or more panels may define a cavity. The power distribution box may include one or more outlets coupled to one or more portions of the one or more panels of the housing. The power distribution box may include one or more output plugs configured to receive one or more power distribution whips. The one or more output plugs may be configured to couple to one or more portions of the one or more panels of the housing. The power distribution box may include one or more circuit breakers coupled to one or more portions of the one or more panels of the housing. The power distribution box may include at least one power whip coupled to an output plug of the one or more output plugs.

20 Claims, 12 Drawing Sheets

(56) References Cited

U.S. PATENT DOCUMENTS

| | | | |
|---|---|---|---|
| 7,719,835 B1 | 5/2010 | Schluter | |
| 7,759,575 B2* | 7/2010 | Jones | H02G 3/086 |
| | | | 174/559 |
| 7,830,043 B1* | 11/2010 | Michael | G06F 1/189 |
| | | | 307/149 |
| 8,341,837 B2* | 1/2013 | Braunstein | H01R 25/006 |
| | | | 324/508 |
| 8,867,193 B2 | 10/2014 | Rasmussen et al. | |
| 8,876,548 B2* | 11/2014 | Doorhy | H01R 25/006 |
| | | | 361/600 |
| 9,166,382 B2* | 10/2015 | Ewing | H01R 13/6691 |
| 9,287,688 B2* | 3/2016 | Ewing | H02B 1/26 |
| 9,466,954 B1 | 10/2016 | Stevens et al. | |
| 9,733,682 B2* | 8/2017 | Butzer | G06F 1/26 |
| 10,154,610 B2* | 12/2018 | Wilson | H01R 25/006 |
| 10,209,727 B2* | 2/2019 | Chapel | H02B 1/04 |
| 10,296,278 B2* | 5/2019 | Kuo | G09G 3/2096 |
| 11,387,658 B2* | 7/2022 | Bonilla | G06F 1/26 |
| 11,664,665 B2* | 5/2023 | Bonilla | G06F 1/26 |
| | | | 307/17 |
| 2002/0057543 A1 | 5/2002 | Carteau et al. | |
| 2006/0146581 A1 | 7/2006 | Murphy | |
| 2015/0084419 A1 | 3/2015 | Wishman et al. | |
| 2018/0269662 A1 | 9/2018 | Song et al. | |
| 2018/0352663 A1 | 12/2018 | Hall et al. | |
| 2019/0361474 A1 | 11/2019 | Chapel et al. | |
| 2019/0379167 A1 | 12/2019 | Li et al. | |
| 2020/0036184 A1 | 1/2020 | Witkoe et al. | |
| 2020/0278732 A1 | 9/2020 | Horvath | |

OTHER PUBLICATIONS

ISX20K20H, may be configured with pre-installed whips, retrieved from https://www.apc.com/shop/my/en/products/InfraStruXure-20kW-400V/P-ISX20K20H?isCurrentSite=true.

Z-PDS, "The Evolution of Power Distribution to the Rack", https://www.zonit.com/uploads/docs/Z-PDS_Product_Sheet_05.16.21.pdf; https://www.zonit.com/zpds/.

Search Report and Written Opinion in International Application No. PCT/US2021/64876 dated Mar. 17, 2022, 10 pages.

* cited by examiner

POWER DISTRIBUTION BOX

CROSS-REFERENCE TO RELATED APPLICATIONS

The present application claims the benefit under 35 U.S.C. § 119 of U.S. Provisional Patent Application No. 63/129,035 filed Dec. 22, 2020, which is hereby incorporated by reference in its entirety.

TECHNICAL FIELD

The present disclosure generally relates to the field of power distribution units, and more particularly to a power distribution box for a rack power distribution unit.

BACKGROUND

Conventional systems employ remote power panels (RPPs), also referred to as floor power distribution units (PDUs), to distribute power to rack power distribution units (rPDUs) within a data center. The RPPs are used to divide the power from an input power source into different circuits using a breaker panel and may be coupled to the rPDUs using PDU whips. The PDU whips may be used to electrically couple the RPP to the rPDUs within the data center. One end of the whip (e.g., the tail of the whip) is hardwired on-site by an electrician into a breaker on the RPP. The other end of the whip contains an outlet to couple to the rPDU. The rPDUs are used to distribute power within a computer cabinet to individual pieces of information technology (IT) equipment.

The hardwiring of the tail of the PDU whip, using an electrician, increases the installation time, the cost of installation, and the cost of materials. Further, working on the data center floor requires the electrician to obtain site access, which is often difficult to obtain. As such, it would be advantageous to provide a system or apparatus to remedy the shortcomings of the conventional approaches identified above.

SUMMARY

Accordingly, the present disclosure is directed to a power distribution box (PDB). The power distribution box may include a housing, one or more outlets, one or more outlet plugs, one or more circuit breakers, and at least one PDU whip.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Reference will now be made in detail to the subject matter disclosed, which is illustrated in the accompanying drawings.

Conventional systems employ remote power panels (RPPs), also referred to as floor power distribution units (PDUs), to distribute power to rack power distribution units (rPDUs) within a data center. The RPPs are used to divide the power from an input power source into different circuits using a breaker panel and may be coupled to the rPDUs using PDU whips. The PDU whips may be used to electrically couple the RPP to the rPDUs within the data center. One end of the whip (e.g., the tail of the whip) is hardwired on-site by an electrician into a breaker on the RPP. The other end of the whip contains an outlet to couple to the rPDU. The rPDUs are used to distribute power within a computer cabinet to individual pieces of information technology (IT) equipment.

The hardwiring of the tail of the PDU whip, using an electrician, increases the installation time, the cost of installation, and the cost of materials. Further, working on the data center floor requires the electrician to obtain site access, which is often difficult to obtain. As such, it would be advantageous to provide a system or apparatus to remedy the shortcomings of the conventional approaches identified above.

Accordingly, the present disclosure is directed to a power distribution box. More particularly, the present disclosure is directed to a power distribution box that simplifies installation and scalability of power distribution units (PDUs) to rack PDUs (rPDUs) by replacing conventional power panels. Specifically, the present disclosure is directed to a power distribution box including at least one PDU whip configured to couple to a portion of the rPDU. In this regard, the power distribution box is able to distribute power to multiple rPDUs using the PDU whip without the need for an electrician, thereby simplifying on-site installation and reducing costs.

FIGS. 1A-4C generally illustrate a power distribution box, in accordance with one or more embodiments of the present disclosure.

FIGS. 1A-1E illustrate a power distribution box 100, in accordance with one or more embodiments of the present disclosure.

The power distribution box 100 may include a housing 102 (or outer chassis 102) including one or more panels 104. For example, the housing 102 may include at least a front panel 104, a back panel 104, one or more side panels 104, a top panel 104, and a rear panel 104. The one or more panels 104 may define a cavity 106 configured to house one or more components of the power distribution box 100, as discussed further herein.

Figure 1A:
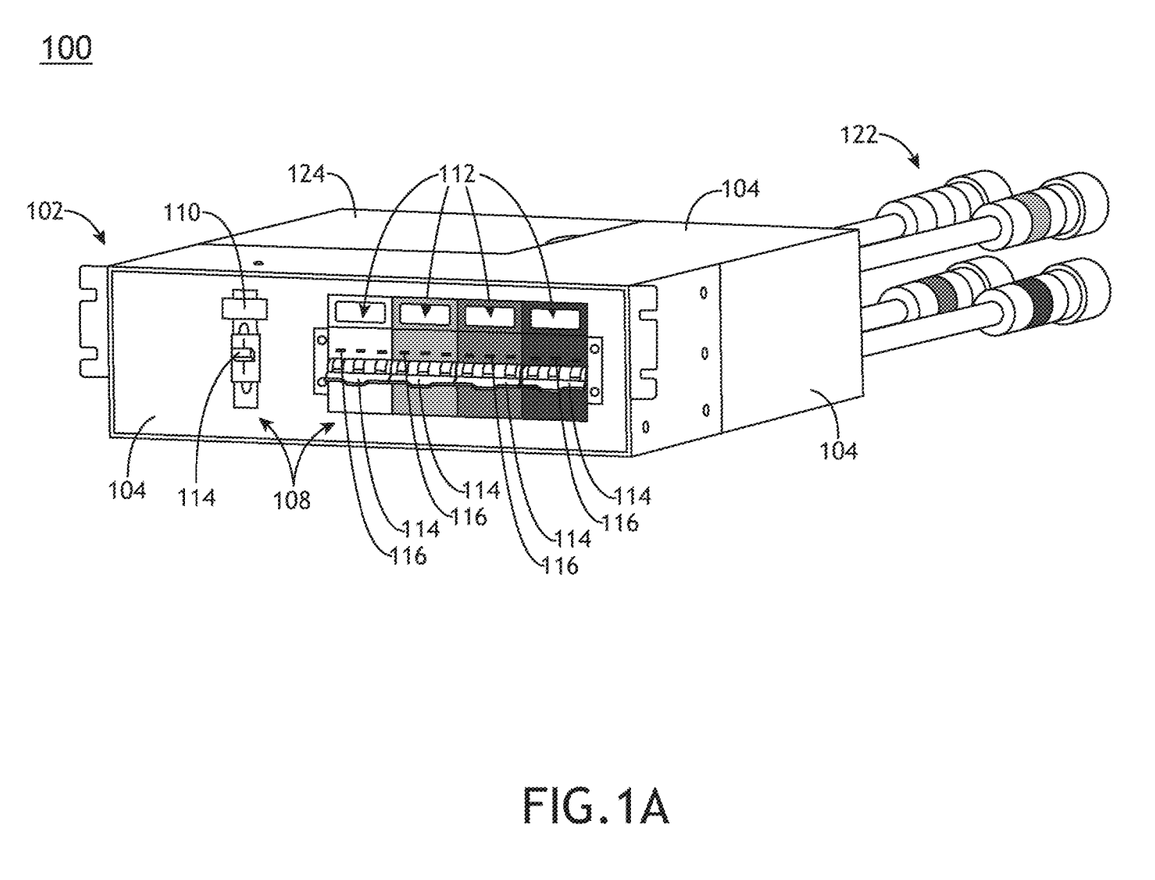
FIG. 1A illustrates a front perspective view of a power distribution box, in accordance with one or more embodiments of the present disclosure.

Referring to FIG. 1A, the power distribution box 100 may include one or more circuit breakers 108 (e.g., a single-pole breaker 110, three-pole breakers 112, or the like). For example, the power distribution box 100 may include one or more circuit breakers 108 coupled to the front panel 104 of the housing 102.

The one or more circuit breakers 108 may be configured to couple to an infrastructure device (e.g., cooling or monitoring system). For example, as shown in FIG. 1A, the power distribution box 100 may include a single-pole circuit breaker 110 for an infrastructure device. For instance, the single-pole circuit breaker 110 may be a 20 amp (U.S.) or 16 amp (EMEA) circuit breaker.

The one or more circuit breakers 108 may be further configured to couple to one or more rack PDUs (rPDUs). The one or more rPDUs may include one or more universal PDUs (UPDUs). A UPDU may refer to a rack power distribution unit that includes a universal input and detachable facility side cable that allows a single model to be installed globally. In one example, the rPDU may be a VERTIV™ GEIST™ Switched Rack Power Distribution Unit, a product of the assignee of the present application. In another example, a UPDU may be a VERTIV™ GEIST™ Universal Power Distribution Unit, a product of the assignee of the present application. Referring once again to FIG. 1A, the power distribution box 100 may include four three-pole circuit breakers 112 for four UPDUs (e.g., two racks). For instance, the three-pole circuit breakers may be 32 amp circuit breakers.

The one or more circuit breakers 108 may include one or more user input devices 114 (e.g., toggles, levers, buttons, or the like) for switching behavior. The one or more circuit breakers 108 may further include one or more visual status indicators 116 to easily identify the circuit status. For example, the one or more circuit breakers 108 may include one or more LED status indicators 116.

Figure 4A:
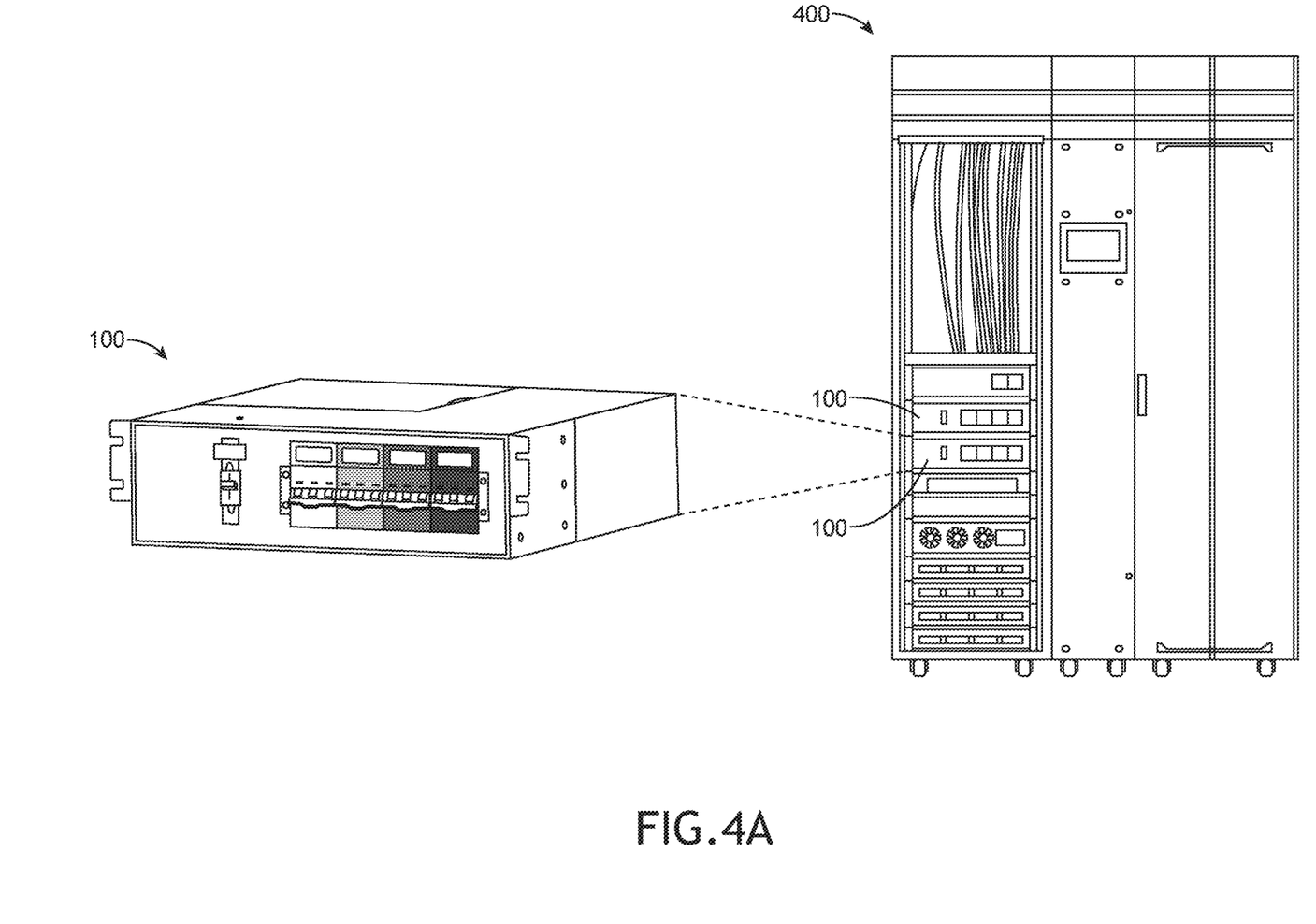
FIG. 4A illustrates a simplified schematic of an infrastructure rack (or cabinet) including one or more power distribution boxes, in accordance with one or more embodiments of the present disclosure.
Figure 4B:
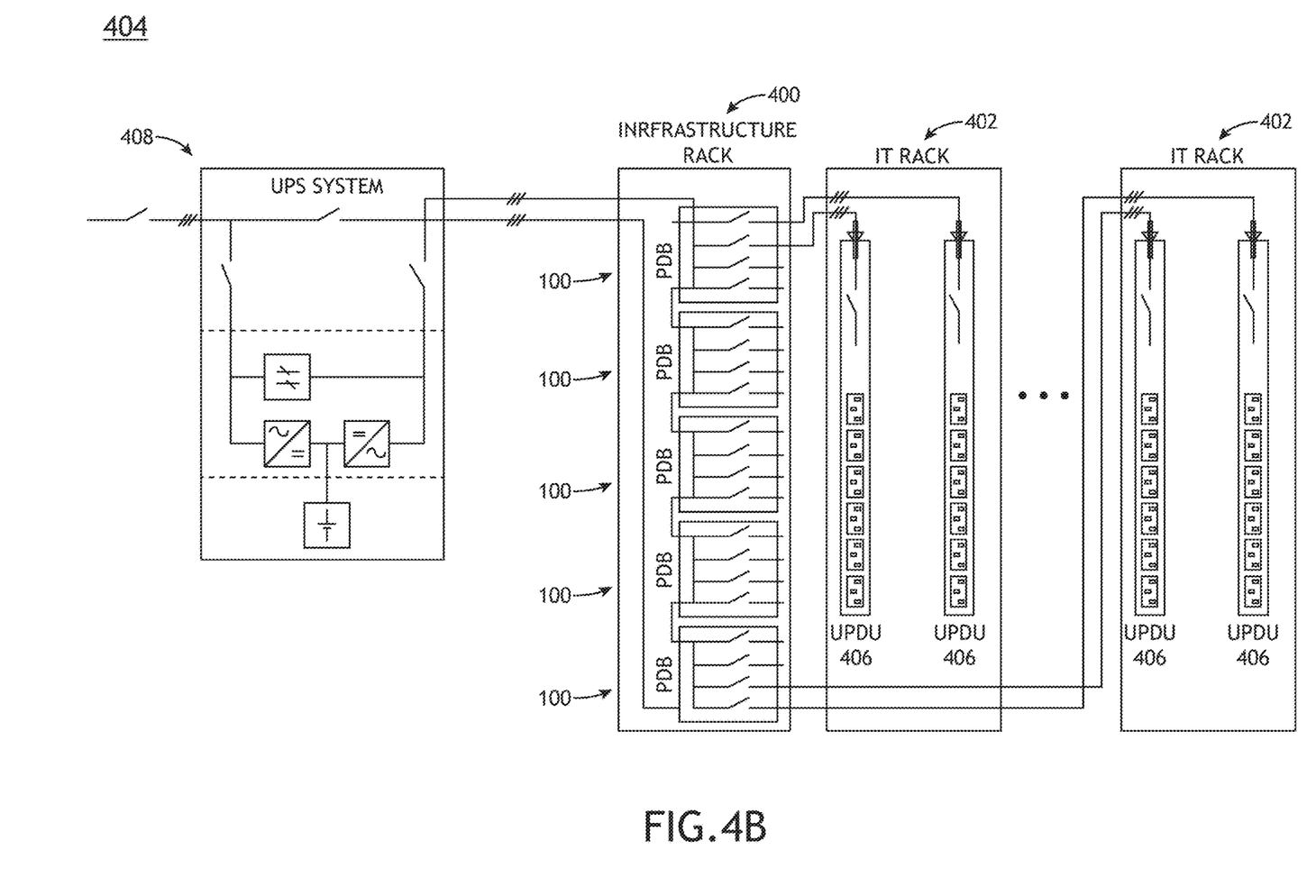
FIG. 4B illustrates a simplified block diagram of a power distribution system including one or more power distribution boxes, in accordance with one or more embodiments of the present disclosure.
Figure 4C:
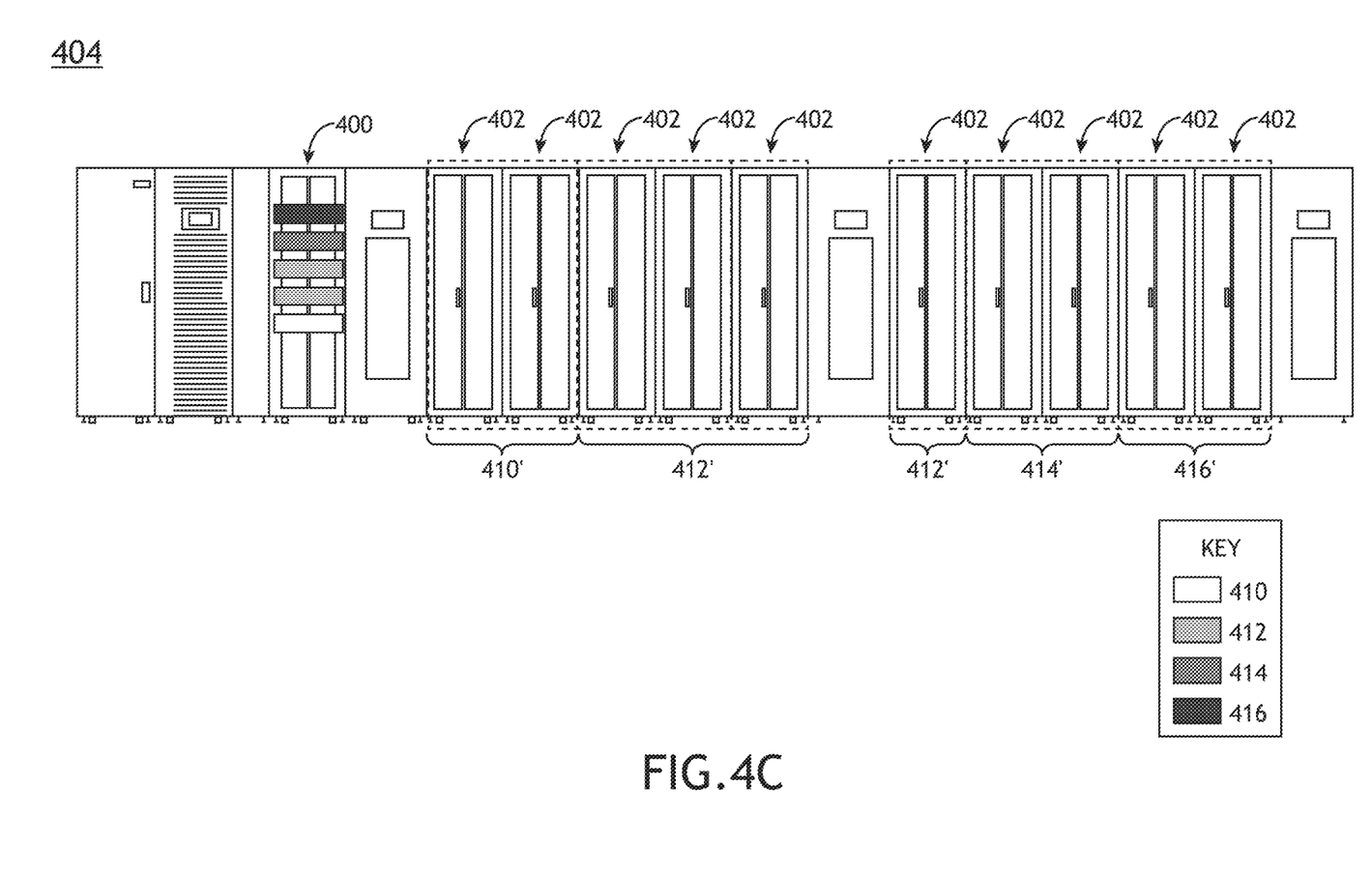
FIG. 4C illustrates a simplified schematic of a power distribution system including one or more power distribution boxes, in accordance with one or more embodiments of the present disclosure.

It is noted that placement of the circuit breakers 108 (e.g., single-pole breaker 110, three-pole breakers 112, or the like) in the front area of the power distribution box 100 (e.g., on the front panel 104) may allow easy monitoring by a data center employee when the power distribution box 100 is mounted within a rack (as discussed further herein with respect to FIGS. 4A-4C).

Figure 1B:
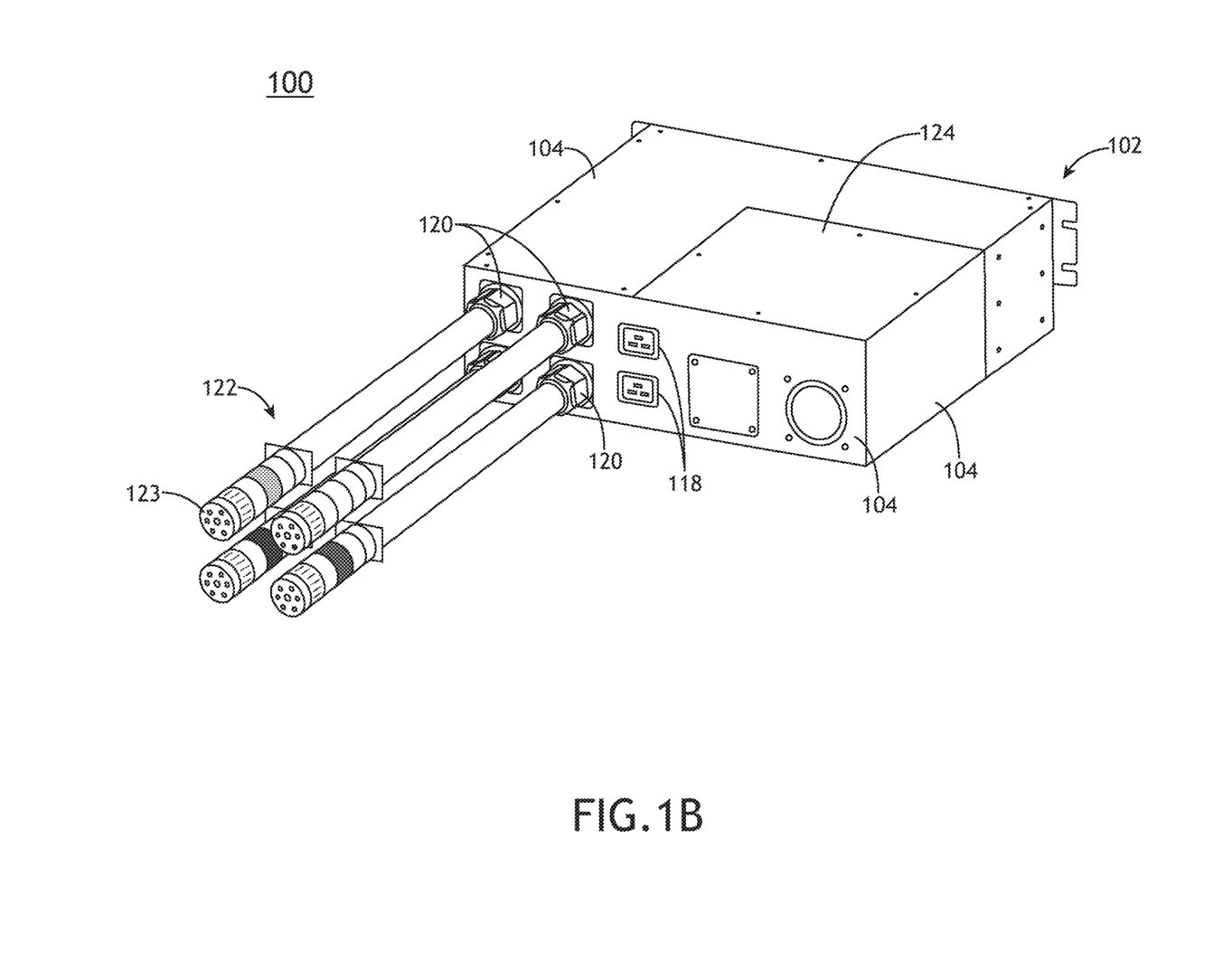
FIG. 1B illustrates a rear perspective view of the power distribution box, in accordance with one or more embodiments of the present disclosure.

Referring to FIG. 1B, the power distribution box 100 may include one or more outlets 118 positioned on the one or more panels 104 of the housing 102. For example, the one or more outlets 118 may be positioned on the back panel 104 of the housing 102. For instance, the power distribution box 100 may include one or more C19 outlets in compliance with IEC60320 standards and configured to receive one or more C20 plugs. Although FIG. 1B depicts the power distribution box 100 including two C19 outlets, it is noted herein that the power distribution box 100 may include any number of outlets and any type of outlet known in the art.

The power distribution box 100 may further include one or more output plugs 120 coupled to one or more portions of the one or more panels 104 of the housing 102. For example, the one or more output plugs 120 may be coupled to one or more portions of the back panel 104 of the housing 102. For instance, the power distribution box 100 may include four output plugs 120 coupled to the back panel 104 of the housing.

The one or more output plugs 120 may be configured to couple to one or more power distribution unit (PDU) whips 122. For example, the one or more output plugs 120 may be coupled to the PDU whips 122 via one or more fastening methods such as, but not limited to, bolts, adhesives (e.g., glue or tape), or the like. By way of another example, the one or more output plugs 120 may include a connecting member configured to couple to the PDU whip 122. In this example, each PDU whip 122 may include a connecting member on a proximal end of the PDU whip (similar to the connecting member 123 on the distal end, as shown in FIG. 1C) and a connecting member 123 on a distal end of the PDU whip 122, where the proximal end connecting member may be configured to couple to a corresponding connecting member of the one or more output plugs 120 and the distal end connecting member 123 may be configured to couple to the rPDU (e.g., UPDU).

The power distribution box 100 may include at least one PDU whip 122 coupled to an output plug of the one or more output plugs 120. For example, as shown in FIGS. 1A-1C, the power distribution box 100 may include four PDU whips 122 (e.g., pre-wired PDU whips) coupled to the four output plugs 120. Each PDU whip 122 may be configured to distribute power to one UPDU. In this regard, the four PDU whips 122 may distribute power to four UPDUs (e.g., two racks).

Figure 1C:
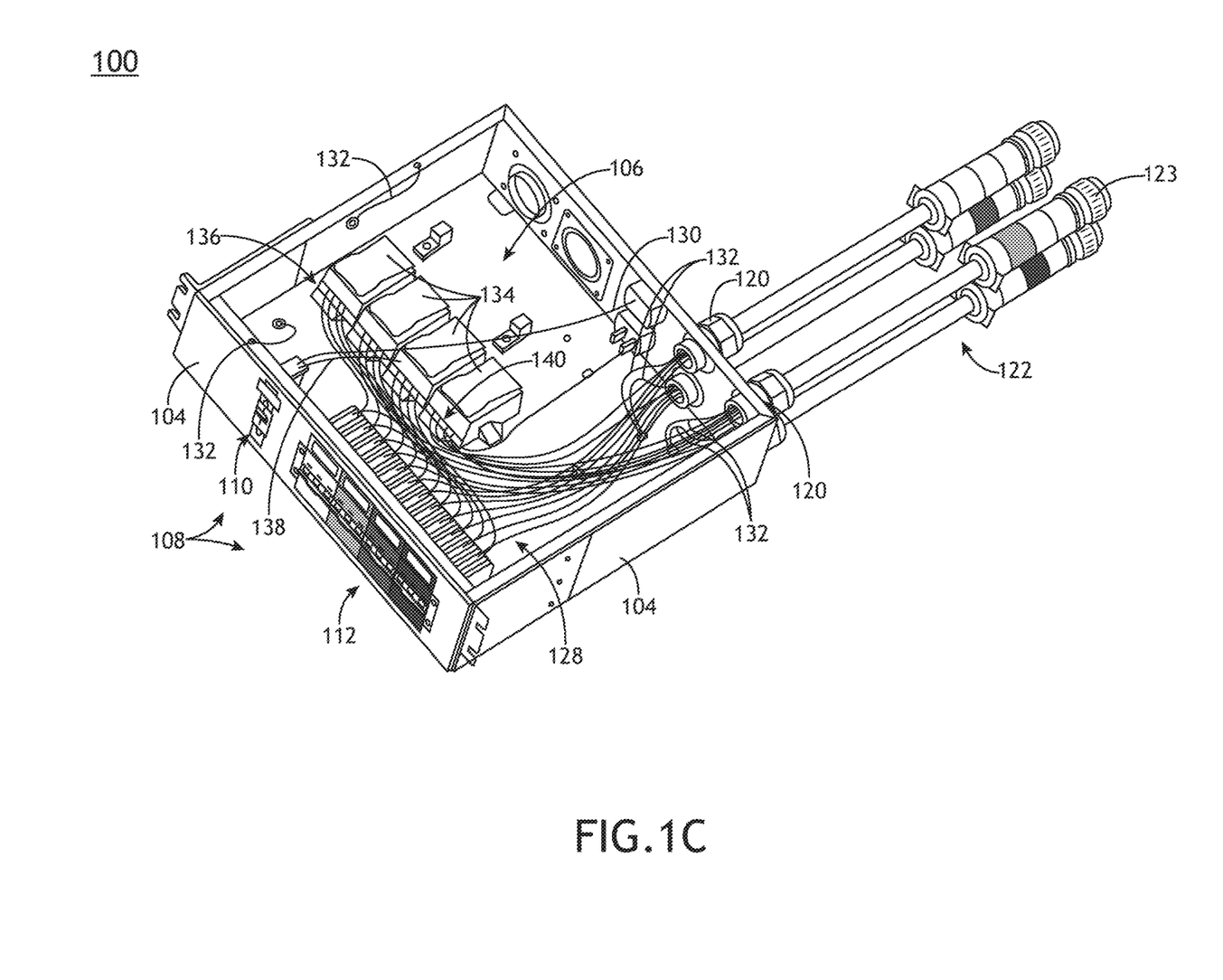
FIG. 1C illustrates a top perspective view of a cavity of the power distribution box, in accordance with one or more embodiments of the present disclosure.
Figure 1D:
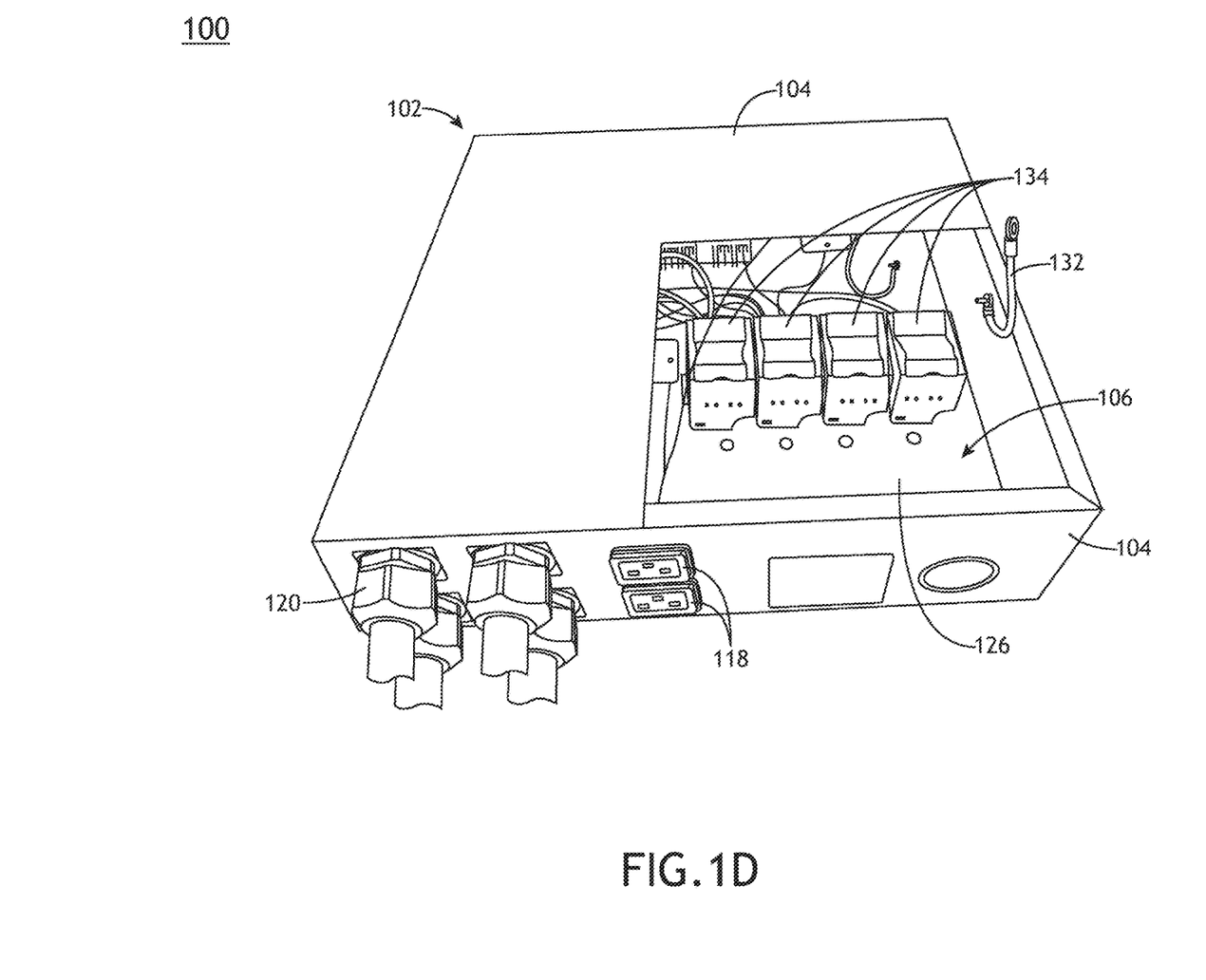
FIGS. 1D-1E illustrate top perspective views of the power distribution box, in accordance with one or more embodiments of the present disclosure.

Referring to FIGS. 1B-1D, the power distribution box 100 may include a removable access panel 124 configured to reversibly couple to one or more portions of the one more panels 104. For example, the removable access panel 124 may be configured to reversibly couple to one or more portions of the top panel 104 of the housing 102. The removable access panel 124, when removed (e.g., not coupled to the one or more panels 104 of the housing 102 or outer chassis), may be configured provide access to one or more components within the power distribution box 100. For example, when removed, the top panel 104 may include an opening 126 to allow access to the one or more components of the power distribution box 100 housed within the cavity 106. The removable access panel, when attached (e.g., coupled to the one or more panels 104 of the outer chassis 102), may be configured to protect the one or more components within the power distribution box 100 from the external environment. The removable access panel may be reversibly couplable to the power distribution box 100 using any fastening method known in the art including, but not limited to, one or more fasteners, one or more hinge assemblies, and the like.

Referring to FIG. 1C, the one or more circuit breakers 108 may be coupled to one or more components of the power distribution box 100 using one or more wires/cables. For example, each of the one or more three-pole circuit breakers 112 for the UPDU may couple to each UPDU (through the PDU whip 122) using a set of wires/cables 128. In this instance, each three-pole circuit breaker 112 may couple to the UPDU via a set of wires/cables 128 including at least a first wire coupled to the first pole of the three-pole breaker 112, a second wire coupled to the second pole of the three-pole breaker 112, and a third wire coupled to the third pole of the three-pole breaker 112. By way of another example, the single-pole circuit breaker 110 for the infrastructure device may couple to the infrastructure device using a single wire 130. In this instance, the infrastructure device is configured to couple to the power distribution box 100 using one of the one or more outlets 118.

Figure 1E:
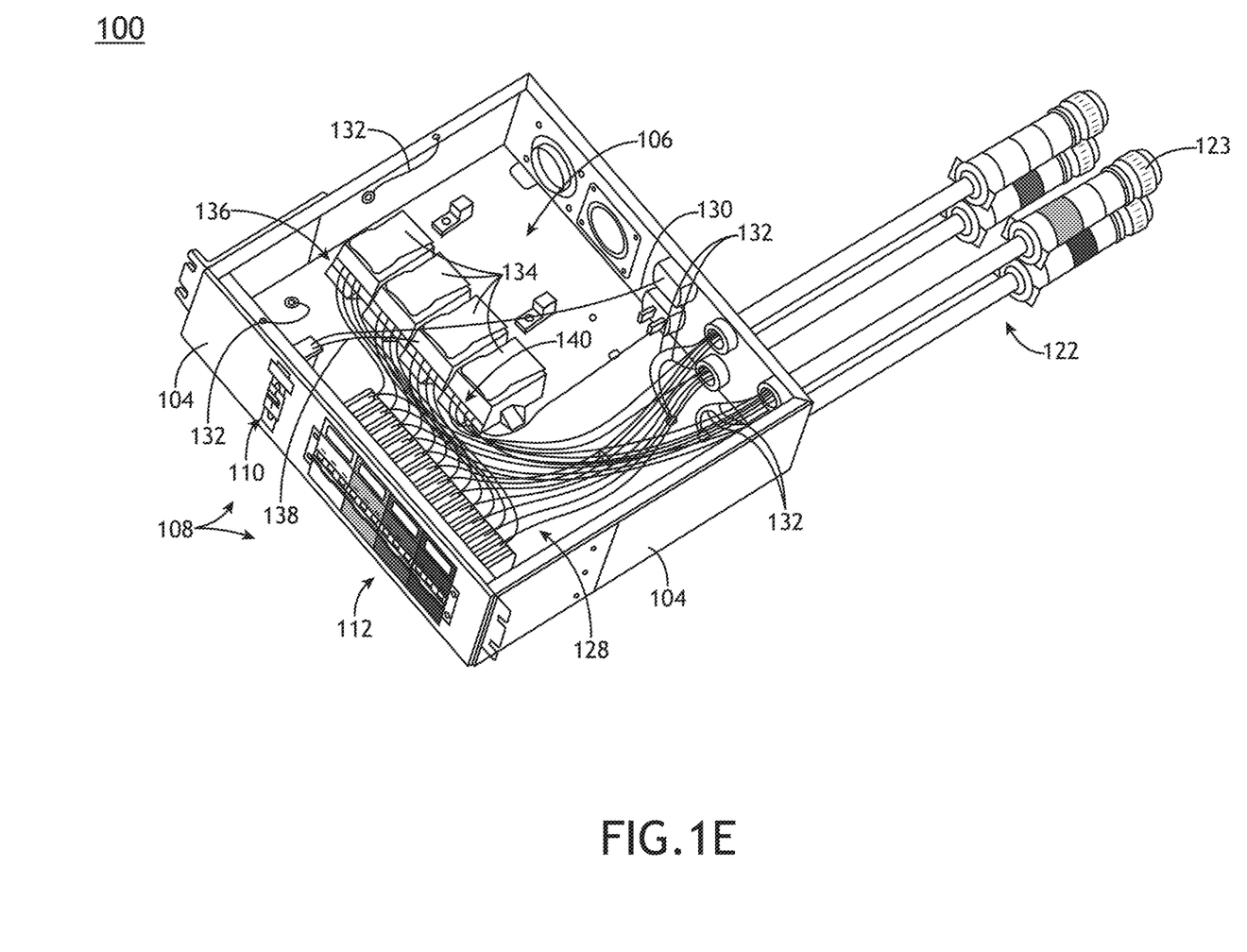

Each PDU whip 122 may couple to the one or more output plugs 120 of the power distribution box 100, such that each PDU whip 122 may connect to a corresponding circuit breaker 112 for the UPDU via the set of wires 128 of the breaker 112 (e.g., the at least first wire, second wire, and third wire). In some embodiments, as shown in FIG. 1E, each PDU whip 122 may be hardwired to a corresponding circuit breaker 112 for the UPDU via the set of wires 128 of the breaker 112. In some embodiments, the one or more output plugs 120 of the power distribution box 100 includes a connecting member configured to couple the PDU whip 122 to the one or more output plugs 120. For example, the PDU whip 122 may include a connecting member on a proximal end of the PDU whip (similar to the connecting member 123 on the distal end, as shown in FIG. 1C) configured to couple to a corresponding connecting member of the one or more output plugs 120. In this example, the corresponding connecting member of the one or more output plugs 120 may be hardwired to a corresponding circuit breaker 112 for the UPDU via the set of wires 128 of the breaker 112, such that the corresponding connecting member of the one or more output plugs 120 may electrically couple each PDU whip 122 to a corresponding circuit breaker 112 for the UPDU. It is noted that where the power distribution box 100 includes a plurality of PDU whips 122, each PDU whip 122 may be connected to a respective breaker.

The power distribution box 100 may further include one or more grounding wires 132. The one or more grounding wires 132 may be configured to ground the separate pieces of metal together. For example, the power distribution box 100 may include one or more grounding wires 132 coupled to one or more portions of the cavity 106 to ground the separate pieces of the metal cavity together. By way of another example, the power distribution box 100 may include one or more grounding wires 132 coupled to the PDU whips 122 and a metal portion of the cavity 106.

Referring to FIGS. 1C-1D, the power distribution box 100 may include one or more distribution blocks 134. Referring to FIG. 1C, the one or more distribution blocks 134 may couple to one or more components of the power distribution box 100. For example, the one or more distribution blocks 134 may couple to the one or more circuit breakers 108. In one instance, the one or more distribution blocks 134 may couple to the one or more circuit breakers 112 for the UPDU using one or more sets of wires 136. In this regard, a first distribution block 134 may couple to a first pole of the one or more circuit breakers 112 via a first set of wires, a second distribution block 134 may couple to a second pole of the one or more circuit breakers 112 via a second set of wires, and a third distribution block may couple to a third pole of the one or more circuit breakers 112 via a third set of wires.

In another instance, the one or more distribution blocks 134 may couple to the one or more circuit breakers 110 for the infrastructure device using a wire 138 of the set of wires 138. In this regard, a distribution block 134 of the one or more distribution blocks 134 may couple to the single pole of the circuit breaker 110 via a single wire 138.

By way of another example, the one or more distribution blocks 134 may couple to one or more PDU whips 122. For instance, as shown in FIG. 1C, a distribution block 134 may couple to a PDU whip 122 via the set of wires 140. The set of wires 140 may be neutral wires (e.g., wire not required to connect to a circuit breaker) configured to directly couple the distribution block 134 to the PDU whip 122.

Figure 2A:
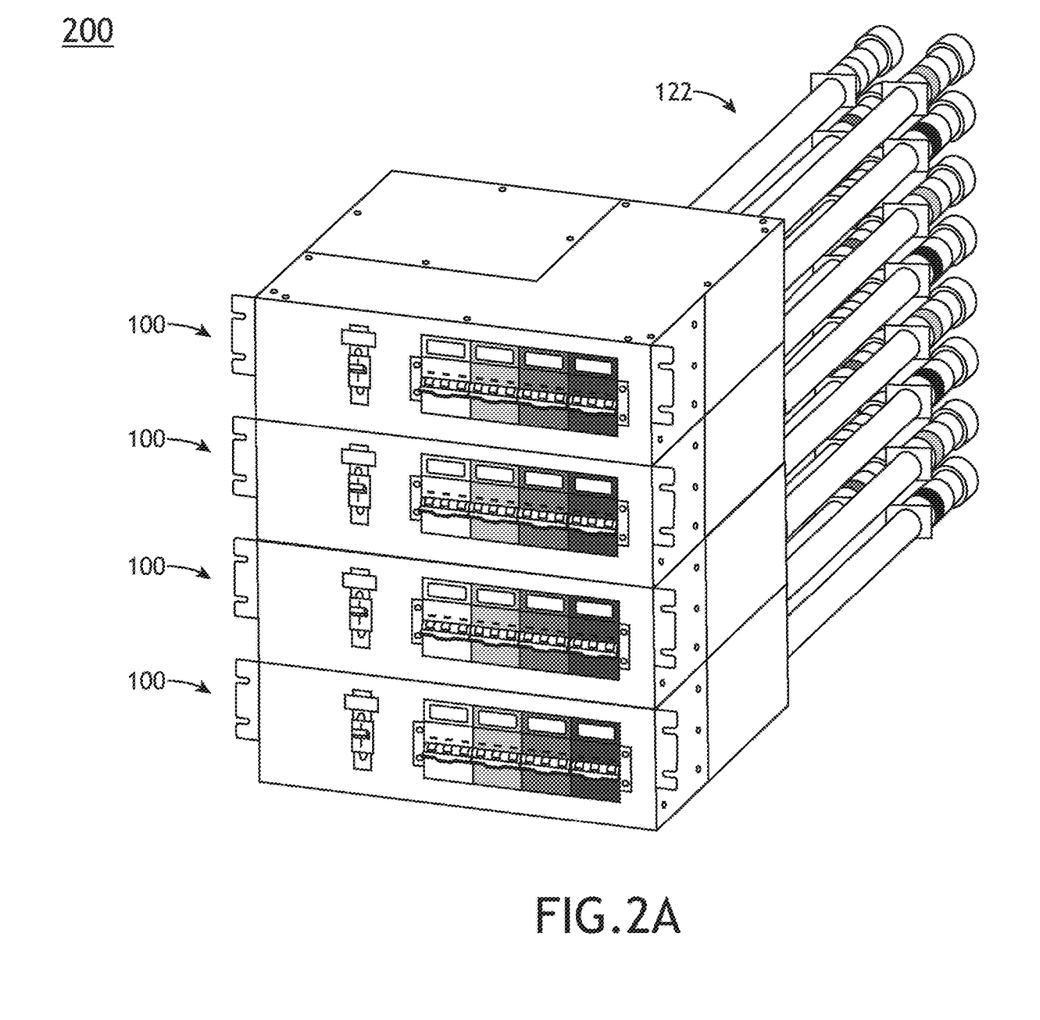
FIG. 2A illustrates a front perspective view of a plurality of power distribution boxes in a daisy-chain configuration, in accordance with one or more embodiments of the present disclosure.
Figure 2B:
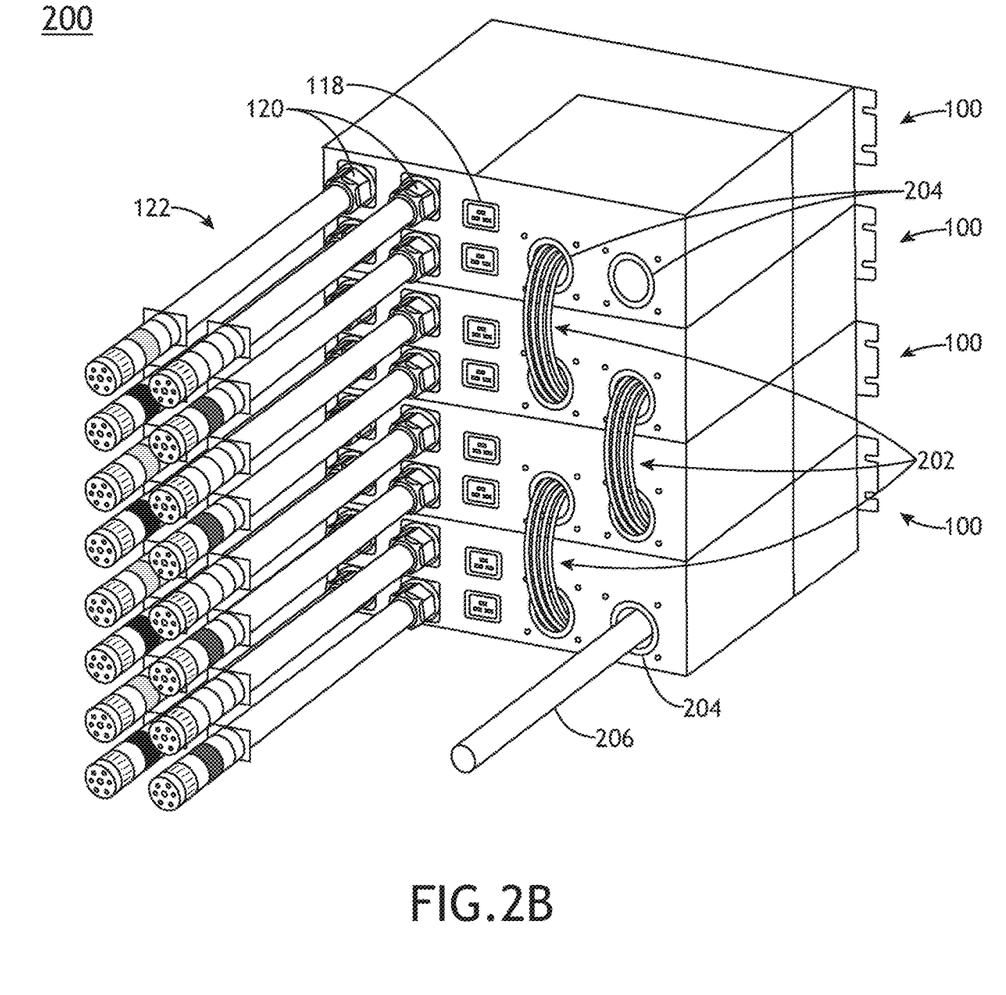
FIG. 2B illustrates a rear perspective view of the plurality of power distribution boxes in the daisy-chain configuration, in accordance with one or more embodiments of the present disclosure.
Figure 2C:
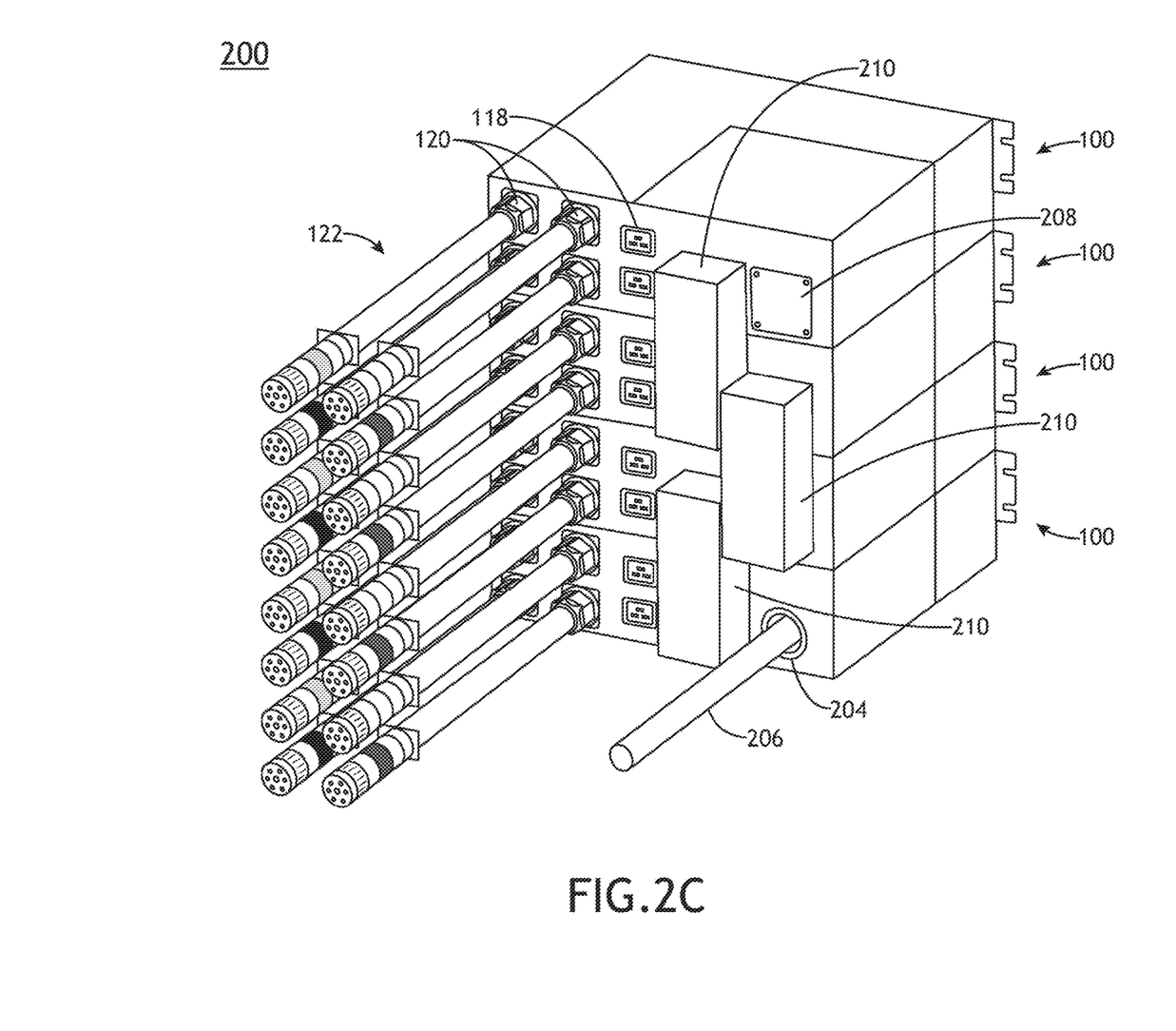
FIG. 2C illustrates a rear perspective view of the plurality of power distribution boxes in the daisy-chain configuration, in accordance with one or more embodiments of the present disclosure.

FIGS. 2A-2C illustrate a plurality of a power distribution boxes 100 in a daisy-chain configuration 200, in accordance with one or more embodiments of the present disclosure. It is noted that the embodiments and enabling technologies described previously herein in the context of the power distribution box 100 and/or the components of the power distribution box 100 should be interpreted to extend to the daisy-chain configuration 200.

The power distribution box 100 may be configured to couple to one or more adjacent power distribution boxes to form a daisy-chain 200 of power distribution boxes 100. For example, as shown in FIGS. 2A-2C, the daisy-chain 200 of power distribution boxes may include at least a first power distribution box, a second power distribution box, a third power distribution box, and a fourth power distribution box. Although FIGS. 2A-2C depict a specific number and configuration of power distribution boxes 100, it is noted that the daisy-chain 200 may include any number and configuration of power distribution boxes 100.

The one or more distribution blocks 134 of the power distribution box 100 may be configured to distribute electrical power from a single input source (e.g., a main power input) to several devices in the branched circuit (e.g., the daisy-chained PDBs 200). For example, the one or more distribution blocks 134 may couple to one or more daisy chain wires 202. Referring to FIG. 2B, the daisy chain wires 202 may be configured to electrically couple a plurality of power distribution boxes 100 together in sequence using the one or more distribution blocks 134 after receiving power from the main input power conductors 206.

Each power distribution box 100 may include one or more openings 204 for the main power input conductors 206 and daisy chain wires 202 to pass through, such that the power distribution boxes 100 are configured for daisy chain capability (e.g., connecting a plurality of power distribution boxes together in a daisy-chain configuration 200). Referring to FIG. 2B, the one or more openings 204 may be configured to receive the one or more daisy chain wires 202 coupled to the one or more distribution blocks 134. Further, the one or more openings 204 may be configured to receive the main power input conductor 206.

The power distribution box 100 configured in the daisy-chain configuration 200 may include one or more input power sources. For example, the power distribution box 100 may include a single input power source coupled to the power distribution box via a first input conductor 206. By way of another example, the power distribution box 100 may include two input power sources coupled to the power distribution box 100 via two input conductors 206.

Referring to FIG. 2C, the power distribution box 100 may further include one or more input covers 208 configured to cover at least a portion of the one or more openings 204. The one or more input covers 208 may be removably couplable to a portion of the power distribution box 100. For example, the one or more input covers 208 may be configured to couple to one or more portions of a back panel 104 of the housing 102 of the power distribution box 100. In this regard, the one or more input covers 208 may be utilized when the one or more openings 204 are not needed (e.g., when not utilizing the daisy chain capability).

Referring to FIG. 2C, the power distribution box 100 may further include one or more daisy wire covers 210 configured to protect the one or more daisy chain wires 202 from the external environment (e.g., prevent the wires from being bumped, or the like). The daisy wire cover 210 may be configured to removably couple to a portion of the power distribution box 100 (e.g., back panel 104 of the housing/outer chassis 102). It is noted that the holes used to fasten the input covers to the power distribution box 100 may be used to fasten the daisy wire cover to the power distribution box, and vice versa.

Figure 3A:
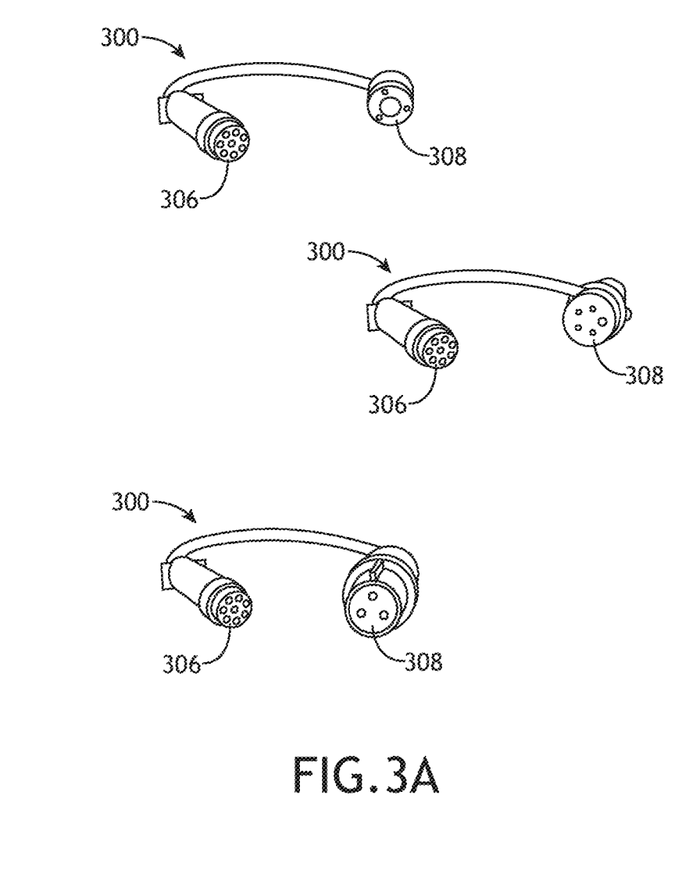
FIG. 3A illustrates a plurality of connecting members of a PDU whip of the power distribution box, in accordance with one or more embodiments of the present disclosure.
Figure 3B:
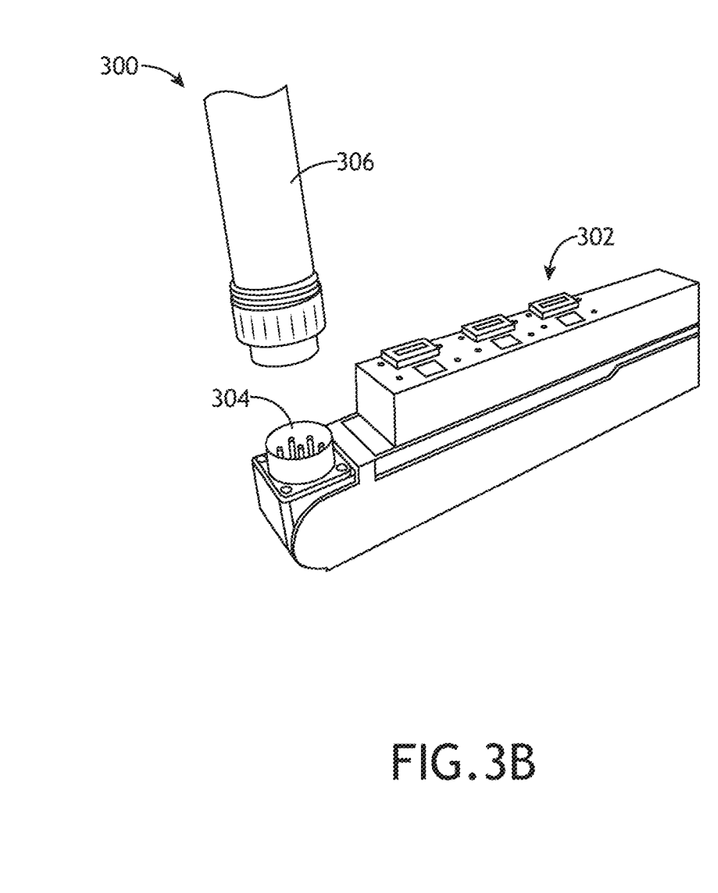
FIG. 3B illustrates a universal input of an UPDU configured to receive a portion of the plurality of connecting members shown in FIG. 3A, in accordance with one or more embodiments of the present disclosure.

FIGS. 3A-3B illustrate one or more connecting members 300 configured to couple the power distribution box 100 to one more UPDUs 302, in accordance with one or more embodiments of the present disclosure.

Each PDU whip 122 may include a connecting member 123 (on the distal end of the whip 122) configured to couple to a UPDU connecting cable 300 (e.g., a facility side cable (FSC) as shown in FIG. 3A). The UPDU connecting cable 300 (e.g., the FSC 300) may be configured to couple to a portion of the UPDU 302. For example, as shown in FIG. 3B, each UPDU 302 may include a universal input 304 configured to receive a portion of the FSC 300. In this regard, a first end 306 of the FSC 300 may couple to the UPDU 302 via the input 304 and the second portion 308 may couple to the PDU whip 122 via a connecting member 123 of the PDU whip 122.

In some embodiments, each PDU whip 122 may couple to an external connecting member configured to couple to the UPDU. For example, one end of the PDU whip may be configured to couple to a connecting member and the other end of the PDU whip may be coupled to one or more components of the power distribution box 100.

In some embodiments, each PDU whip 122 may include a connecting member configured to directly couple to the UPDU. For example, the connecting member of the PDU whip may be configured to couple to a complementary plug on the UPDU.

Although embodiments of the present disclosure are directed to coupling the power distribution box 100 to one or more UPDUs, it is noted that the power distribution box 100 may be configured to couple to any suitable rack power distribution unit (rPDU) using any corresponding connecting member and/or adaptor.

Referring to FIGS. 1A-2C, one or more components of the power distribution box 100 may be color coded. For example, the one or more circuit breakers 112 coupled to the UPDUs may be color coded to easily match which circuit is coupled to which UPDU via the PDU whip 122. In one instance, a first three-pole circuit breaker may be color coded white and a portion of the corresponding PDU whip 122 may be color coded white. In another instance, a second three-pole circuit breaker may be color coded grey and a portion of the corresponding PDU whip 122 may be color coded grey. In another instance, a third three-pole circuit breaker may be color coded dark grey and a portion of the corresponding PDU whip 122 may be color coded dark grey. In another instance, a fourth three-pole circuit breaker may be color coded black and a portion of the corresponding PDU whip 122 may be color coded black. Although FIGS. 1A-2C depict a specific color coding scheme, it is noted that the one or more components of the power distribution box 100 may be color coded using any suitable identification scheme.

By way of another example, the one or more output plugs 120 of the PDU whips 122 may be color coded to match the one or more color codes of the one or more circuit breakers 112, such that the UPDUs may be easily matched to the corresponding breaker. In one instance, a first output plug may be color coded a first color to match the first circuit breaker color that is color coded the first color. In another instance, a second output plug may be color coded a second color to match the second circuit breaker color that is color coded the second color. In another instance, a third output plug may be color coded a third color to match the third circuit breaker color that is color coded the third color. In another instance, a fourth output plug may be color coded a fourth color to match the fourth circuit breaker color that is color coded the fourth color.

FIGS. 4A-4C illustrate one or more components of a power distribution system 404 including one or more power distribution boxes 100, in accordance with one or more embodiments of the present disclosure. In particular, FIG. 4A depicts an infrastructure rack or cabinet 400 including one or more power distribution boxes 100, in accordance with one or more embodiments of the present disclosure. In particular, FIGS. 4B-4C depict the power distribution system 404 including an infrastructure rack or cabinet 400 (including one or more power distribution boxes (PDBs) 100), one or more IT racks 402 (including one or more UPDUs 406), and a power supply (UPS) 408, in accordance with one or more embodiments of the present disclosure.

Referring to FIG. 4A, the power distribution box 100 may be configured to be placed within an infrastructure rack or cabinet 400. The infrastructure rack or cabinet 400 may be configured to hold a plurality of power distribution boxes 100. For example, the one or more outlets 118 may be configured to provide power to equipment housed within the infrastructure rack or cabinet 400.

Referring to FIGS. 4B-4C, the power distribution box 100 of the present disclosure may be configured to distribute power to one or more information technology (IT) racks 402 within the power distribution system 404. For example, as shown in FIG. 4B, a plurality of power distribution boxes 100 may be configured to distribute power to a plurality of UPDUs 406 within the plurality of IT racks 402. Each power distribution box 100 may be configured to distribute power to two racks (e.g., four UPDUs).

Referring to FIG. 4B, the power distribution boxes 100 within the infrastructure rack 400 may be configured to couple to a power supply (UPS) 408 via standard AWG cables. The power distribution box 100 may distribute power using the PDU whips to the UPDUs. The PDU whips are configured to interface with the FSCs, which connect the UPDUs to the PDU whips of the power distribution box.

Referring to FIG. 4C, the at least one PDU whip 122 of the power distribution box 100 may be a predetermined length based on the number of IT racks/UPDUs and the distance to the IT racks/UPDUs. For example, a first PDU whip 122 may have a first length 410 corresponding to a first set 410' of infrastructure racks 402. For instance, the first PDU whip 122 may be approximately 18 feet and correspond to the first set of racks 410'. By way of another example, a second PDU whip 122 may have a second length 412 corresponding to a second set 412' of infrastructure racks 402. For instance, the second PDU whip 122 may be approximately 25 feet and correspond to the second set of racks 412'. By way of another example, a third PDU whip 122 may have a third length 414 corresponding to a third set 414' of infrastructure racks 402. For instance, the third PDU whip 122 may be approximately 31 feet and correspond to the third set of racks 416'. By way of another example, a fourth PDU whip 122 may have a fourth length 416 corresponding to a fourth set 416' of infrastructure racks 402. For instance, the fourth PDU whip 122 may be approximately 35 feet and correspond to the fourth set of racks 416'.

It is noted herein that the power distribution box 100 may operate in compliance with both U.S. and EMEA standards. For example, the power distribution box 100 may be configured to receive both WYE (EMEA) and Delta (Δ) (U.S.) input power.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A power distribution box, the power distribution box comprising:
   a housing including one or more panels, the one or more panels at least partially defining a cavity;
   one or more outlets coupled to the one or more panels of the housing;
   one or more circuit breakers coupled to the one or more panels of the housing; and
   at least one pre-wired power distribution whip, the at least one pre-wired power distribution whip being hardwired to at least one circuit breaker of the one or more circuit breakers, the at least one pre-wired power distribution whip including a connecting member to directly couple to a rack power distribution unit (rPDU) of one or more rPDUs, the at least one pre-wired power distribution whip having a predetermined length corresponding to a number and arrangement of the one or more rPDUs on a data center floor.

2. The power distribution box of claim 1, further comprising:
   two or more distribution blocks housed within a portion of the cavity of the housing, a first distribution block of the two or more distribution blocks configured to couple to the at least one circuit breaker of the one or more circuit breakers, a second distribution block of the two or more distribution blocks configured to couple to the at least one pre-wired power distribution whip.

3. The power distribution box of claim 2, wherein the first distribution block of the two or more distribution blocks is configured couple to a second power distribution box arranged adjacent to the power distribution box via one or more daisy chain wires.

4. The power distribution box of claim 3, wherein the first distribution block of the two or more distribution blocks is configured to distribute power from a single input source to the second power distribution box arranged adjacent to the power distribution box.

5. The power distribution box of claim 1, further comprising:
   one or more removable access panels configured to reversibly couple the one or more panels of the housing.

6. The power distribution box of claim 1, wherein the connecting member of the at least one pre-wired power distribution whip includes a facility side cable connecting member configured to couple to a facility side cable.

7. The power distribution box of claim 6, wherein the facility side cable is configured to couple to the rPDU.

8. The power distribution box of claim 1, wherein the one or more circuit breakers comprise:

one or more rack product distribution unit circuit breakers.

9. The power distribution box of claim 1, wherein the one or more circuit breakers comprise:
one or more infrastructure device circuit breakers.

10. The power distribution box of claim 1, wherein the one or more circuit breakers include one or more visual status indicators.

11. The power distribution box of claim 1, wherein the one or more circuit breakers include one or more user input devices.

12. A power distribution box, the power distribution box comprising:
a housing including one or more panels, the one or more panels at least partially defining a cavity;
one or more outlets coupled to a back panel of the one or more panels of the housing, the one or more outlets configured to provide power to equipment housed within an infrastructure rack;
a plurality of circuit breakers coupled to a front panel of the one or more panels of the housing to allow for easy monitoring by a data center user when the power distribution box is mounted within the infrastructure rack;
a plurality of pre-wired power distribution whips arranged on the back panel of the one or more panels of the housing, the plurality of pre-wired power distribution whips each being coupled to at least one circuit breaker of the plurality circuit breakers, the plurality of pre-wired power distribution whips including a connecting member to couple to a rack power distribution unit (rPDU) of one or more rPDUs arranged adjacent to the infrastructure rack; and
two or more distribution blocks housed within a portion of the cavity of the housing and arranged adjacent to an internal portion of the plurality of circuit breakers, a first distribution block of the two or more distribution blocks configured to couple to the at least one circuit breaker of the plurality of circuit breakers, a second distribution block of the two or more distribution blocks being hardwired to the plurality of pre-wired power distribution whips.

13. The power distribution box of claim 12, wherein the first distribution block of the two or more distribution blocks is configured to couple to a second power distribution box arranged adjacent to the power distribution box via one or more daisy chain wires.

14. The power distribution box of claim 13, wherein the first distribution block of the two or more distribution blocks is configured to distribute power from a single input source to the second power distribution box arranged adjacent to the power distribution box.

15. The power distribution box of claim 12, wherein the connecting member of the plurality of pre-wired power distribution whips include a facility side cable connecting member configured to couple to a facility side cable.

16. The power distribution box of claim 15, wherein the facility side cable is configured to couple to the rPDU.

17. The power distribution box of claim 12, wherein the plurality of circuit breakers comprise:
one or more rack power distribution unit three-pole circuit breakers.

18. The power distribution box of claim 12, wherein the plurality of circuit breakers comprise:
one or more infrastructure device single-pole circuit breakers.

19. A system comprising:
a plurality of power distribution boxes, the plurality of power distribution boxes including at least a first power distribution box and a second power distribution box, wherein the second power distribution box is arranged adjacent to the first power distribution box, each power distribution box of the plurality of power distribution boxes comprising:
a housing including one or more panels, the one or more panels at least partially defining a cavity;
one or more outlets coupled to the one or more panels of the housing;
one or more circuit breakers coupled to the one or more panels of the housing;
at least one pre-wired power distribution whip, the at least one pre-wired power distribution whip being hardwired to at least one circuit breaker of the one or more circuit breakers, the at least one pre-wired power distribution whip including a connecting member to couple to a rack power distribution unit (rPDU) of one or more rPDUs;
two or more distribution blocks housed within a portion of the cavity of the housing, a first distribution block of the two or more distribution blocks configured to couple to the at least one circuit breaker of the one or more circuit breakers, a second distribution block of the two or more distribution blocks being hardwired to the at least one pre-wired power distribution whip;
one or more openings arranged on a panel of the one or more panels of the housing, and
at least one opening of the one or more openings configured to receive a portion of one or more daisy chain wires;
at least one additional opening of the one or more openings of at least one of the at least the first power distribution box or the second power distribution box configured to receive one or more main power input conductors,
the first distribution block of the two or more distribution blocks of the at least the first power distribution box being configured to couple to at least one distribution block of the two or more distribution blocks of the second power distribution box via the one or more daisy chain wires,
the first distribution block of the two or more distribution blocks of one of the at least the first power distribution box and the second power distribution box being configured to distribute power from a single input source of the one or more main power input conductors to another of the at least the first power distribution box and the second power distribution box.

20. The system of claim 19, further comprising:
one or more daisy chain wire covers to protect the one or more daisy chain wires coupling the at least the first power distribution box to the second power distribution box.

* * * * *